(12) United States Patent
McCune, Jr.

(10) Patent No.: US 8,405,465 B2
(45) Date of Patent: Mar. 26, 2013

(54) DUTY CYCLE TRANSLATOR METHODS AND APPARATUS

(76) Inventor: Earl W. McCune, Jr., Santa Clara, CA (US)

( * ) Notice: Subject to any disclaimer, the term of this patent is extended or adjusted under 35 U.S.C. 154(b) by 79 days.

(21) Appl. No.: 12/949,710

(22) Filed: Nov. 18, 2010

(65) Prior Publication Data

US 2012/0126909 A1    May 24, 2012

(51) Int. Cl.
    H03K 7/08    (2006.01)
(52) U.S. Cl. .................... 332/109; 327/105; 327/175
(58) Field of Classification Search .................. 332/109; 327/105, 175
    See application file for complete search history.

(56) References Cited

U.S. PATENT DOCUMENTS

| | | | |
|---|---|---|---|
| 5,095,264 | A | 3/1992 | Hulsing, II |
| 5,396,244 | A | 3/1995 | Engel |
| 6,483,730 | B2 | 11/2002 | Johnson |
| 6,577,517 | B2 | 6/2003 | Jain et al. |
| 6,870,355 | B2 | 3/2005 | Iwahori |
| 7,602,164 | B2 | 10/2009 | Vo |
| 2008/0111620 | A1 | 5/2008 | Menard et al. |
| 2008/0252351 | A1 | 10/2008 | Deppe et al. |
| 2009/0184666 | A1 | 7/2009 | Myers et al. |
| 2009/0184736 | A1 | 7/2009 | De Rijk et al. |
| 2009/0303762 | A1 | 12/2009 | Jang et al. |
| 2010/0014329 | A1 | 1/2010 | Zhang et al. |
| 2010/0123403 | A1 | 5/2010 | Reed |

OTHER PUBLICATIONS

J. Turchi, ON Semiconductor Application Note AND8392/D, "A 800 W Bridgeless PFC Stage," Feb. 2009.
U. Moriconi, ST Microelectronics Application Note AN1606, "A 'Bridgeless P.F.C. Configuration' Based on L4981 P. F.C. Controller," Nov. 2002.

B. Lu, "Bridgeless PFC Implementation Using One Cycle Control Technique," Twentieth Annual IEEE Applied Power Electronics Conference and Exposition (APEC), pp. 812-817, vol. 2, 2005.
Y. Jang et al., "A Bridgeless PFC Boost Rectifier with Optimized Magnetic Utilization," IEEE Transactions on Power Electronics, vol. 24, No. 1, Jan. 2009.
L. Zuechao, Texas Instruments Application Report SLUA517, "UCC 28070 Implement Bridgeless Power Factor Correction (PFC) Pre-Regulator Design," Jul. 2009.
PCT/US2011/044572 International Search Report (PCT/ISA/210), Nov. 2011 (from related PCT application).
E. McCune, "AC/DC Power Conversion Methods and Apparatus," U.S. Appl. No. 12/841,608, filed Jul. 22, 2010.
E. McCune, "Power Conversion and Control Systems and Methods for Solid-State Lighting," U.S. Appl. No. 12/897,081, filed Oct. 4, 2010.
E. McCune, "Power Conversion and Control Systems and Methods for Solid-State Lighting," U.S. Appl. No. 12/897,094, filed Oct. 4, 2010.

(Continued)

*Primary Examiner* — Joseph Chang
*Assistant Examiner* — Jeffrey Shin
(74) *Attorney, Agent, or Firm* — Patent Law Professionals, P.C.; William E. Winters

(57) ABSTRACT

Methods and apparatus for translating duty cycle information in duty-cycle-modulated signals to higher frequencies or higher data rates. An exemplary duty cycle translator includes a duty cycle evaluator, a high-speed digital counter, and a comparator. The duty cycle evaluator generates a first digital number representing a duty cycle of a low-frequency input duty-cycle-modulated (DCM) signal. The comparator compares the first digital number to a second digital number generated by the high-speed digital counter, and generates, based on the comparison, an output DCM signal having a higher frequency or data rate than the frequency or data rate of the low-frequency input DCM signal but a duty cycle that is substantially the same as the duty cycle of the low-frequency input DCM signal.

2 Claims, 10 Drawing Sheets

OTHER PUBLICATIONS

E. McCuneE, "Power Conversion and Control Systems and Methods for Solid-State Lighting," U.S. Appl. No. 12/897,066, filed Oct. 4, 2010.

Zywyn Corporation New Release, "Zywyn Announces Universal Transformerless AC-DC Constant Current LED Driver," Sunnyvale, California, Dec. 8, 2006 (retrieved from the Internet (URL: http://zywyn.com/pdf/PressReleases/pressReleaseZD831.pdf)).

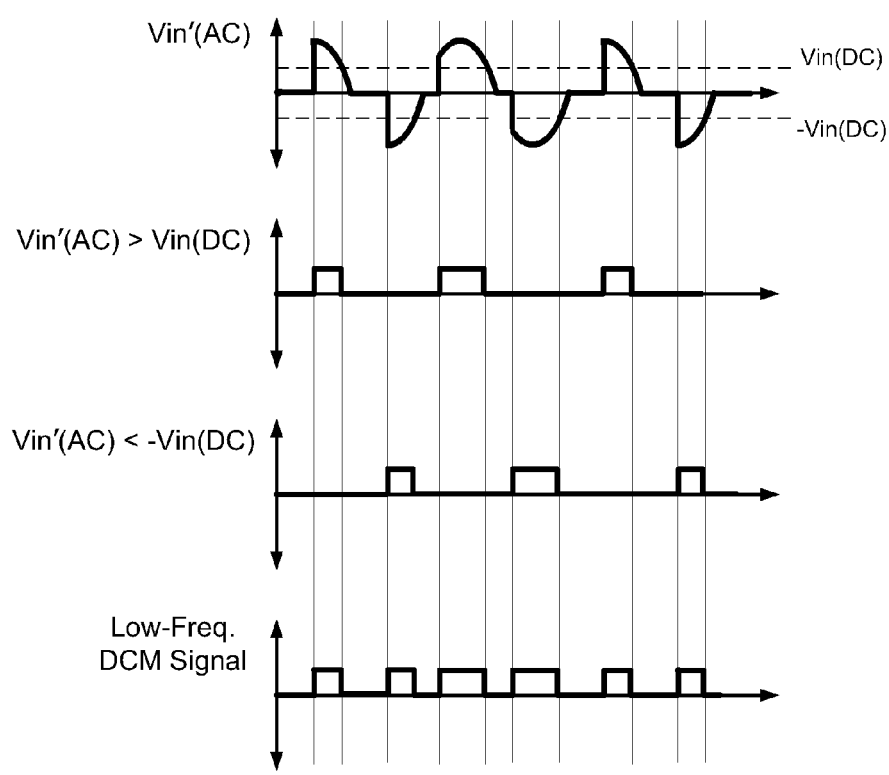

DUTY CYCLE TRANSLATOR METHODS AND APPARATUS

FIELD OF THE INVENTION

The present invention relates in general to electrical and electronic systems and in particular to methods and apparatus for translating duty cycle information in a duty-cycle-modulated signal to higher frequencies.

BACKGROUND OF THE INVENTION

Duty cycle modulation is a technique in which pulses, or a relationship among pulses, in a pulse wave are varied to encode information or control power delivery to a load. The term "duty cycle" refers to the fraction of time a duty-cycle-modulated (DCM) signal is active high over some specified interval of time, often the time interval between consecutive rising edges of the pulse waveform. In general, duty cycle may be used to describe periodic, semi-periodic, and aperiodic DCM signals. In a periodic DCM signal, for example, the interval of time corresponds to the period of the signal, and the duty cycle is defined for each signal period as the fraction of time during which the signal is high.

DCM signals are generated in various ways. In one commonly-used approach, pulse widths of a signal are varied to produce the desired DCM signal. DCM signals generated using this approach are referred to as a "pulse width modulated" or "PWM" signals. In another approach the pulse widths are fixed but the times between pulses are varied to produce a DCM signal having a variable pulse density. DCM signals generated by this latter approach are referred to as "pulse density modulated" or "PDM" signals or, alternatively, "pulse-frequency modulated" or "PFM" signals.

There are various circumstances where it is necessary or it would be desirable to translate duty cycle information in DCM signals to higher frequencies or higher data rates. The present invention addresses these needs and desires.

SUMMARY OF THE INVENTION

Methods and apparatus for translating duty cycle information in duty-cycle-modulated signals to higher frequencies or higher data rates are disclosed. An exemplary duty cycle translator includes a duty cycle evaluator, a high-speed digital counter, and a comparator. The duty cycle evaluator generates a first digital number representing a duty cycle of a low-frequency input duty-cycle-modulated (DCM) signal. The comparator compares the first digital number to a second digital number generated by the high-speed digital counter, and generates, based on the comparison, an output DCM signal having a higher frequency or data rate than the frequency or data rate of the low-frequency input DCM signal but a duty cycle that is substantially the same as the duty cycle of the low-frequency input DCM signal.

Further features and advantages of the invention, including descriptions of the structure and operation of the above-summarized and other exemplary embodiments of the invention, will now be described in detail with respect to accompanying drawings, in which like reference numbers are used to indicate identical or functionally similar elements.

BRIEF DESCRIPTION OF THE DRAWINGS

FIGS. 10A-D are signal diagrams of signals generated by the DCM signal generator in FIG. 9.

DETAILED DESCRIPTION

Figure 1:
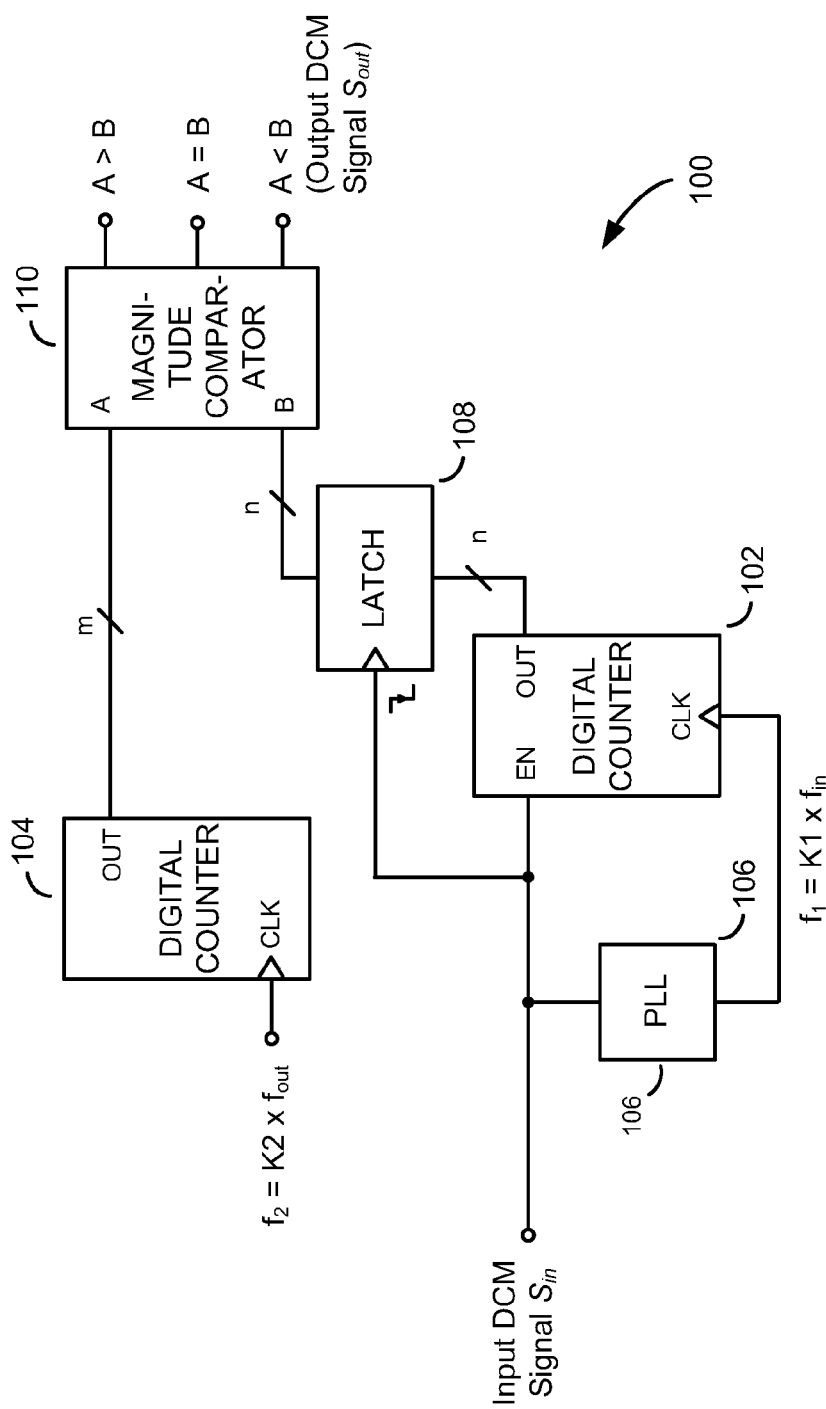
FIG. 1 is a circuit diagram of a duty cycle translator, according to an embodiment of the present invention.

Referring to FIG. 1, there is shown an exemplary duty cycle translator 100, according to an embodiment of the present invention. The duty cycle translator 100 comprises first and second digital counters 102 and 104, a phase-locked loop (PLL) 106, a latch (or other similar memory device) 108, and a digital magnitude comparator 110, and may be formed using discrete components, one or more integrated (IC) chips, or a combination of discrete components and IC chips. As explained in detail below, the duty cycle translator 100 operates to translate an input duty-cycle-modulated (DCM) signal $S_{in}$ to a higher frequency output DCM signal $S_{out}$ while preserving the duty cycle information contained in the original input DCM signal $S_{in}$. In some of the exemplary embodiments described below, the input DCM signal $S_{in}$ is described as being periodic. However, as will be appreciated by those of ordinary skill in the art with the benefit of the detailed description that follows, the duty translator methods and apparatus of the present invention are not limited to operating on periodic DCM signals. Accordingly, for the purpose of this disclosure, the term "duty-cycle-modulated signal" will refer to and incorporate within its meaning periodic, aperiodic, and variable periodicity (i.e., semi-periodic) signals, including, for example, pulse-width modulated (PWM) signals and pulse-density modulated (PDM) signals (i.e., pulse-frequency modulated (PFM) signals).

The first digital counter 102 and latch 108 are configured to generate an n-bit digital number representing the duty cycle of the input DCM signal $S_{in}$, and together comprise one way of implementing what may be referred to as a "duty cycle evaluator." The first digital counter 102 is configured to receive the input DCM signal $S_{in}$ at its enable (EN) input, and the latch 108 is configured to receive the input DCM signal $S_{in}$ at its clock (CLK) input. The clock input of the first digital counter 102 is configured to receive a first digital counter clock signal of frequency $f_1 = K1 \times f_{in}$, where K1 is a resolution factor and $f_{in}$ is the input frequency of the input DCM signal $S_{in}$. The first digital counter clock signal is generated by the PLL 106 (or other suitable clock generating or recovery circuit) based on pulse transitions in the input DCM signal $S_{in}$.

Upon detecting a rising edge of a pulse in the input DCM signal $S_{in}$, the first digital counter 102 commences counting from zero, at a rate $f_1$, and continues counting until the latch 108 detects the falling edge of the pulse, at which time the present count of the first digital counter 102 is latched into the latch 108 and coupled to the "B" input of the digital magnitude comparator 110. The present count is represented by an n-bit digital number that is proportional to the width (i.e., duration) of the pulse and is representative of the duty cycle of the input DCM signal $S_{in}$ for the period being measured. The first digital counter 102 and latch 108 repeat this count and latch operation on subsequent pulses in the input DCM signal $S_{in}$, generating and latching a unique count for each pulse received.

The second digital counter 104 is configured to repeatedly and continuously count from zero to K2-1, according to a second digital counter clock applied to the clock (CLK) input of the second digital counter 104. The second digital counter clock has a frequency $f_2=K2 \times f_{out}$, where K2 is a resolution factor, $f_{out}=M \times f_{in}$ is the frequency of a high-frequency clock, and M is an integer or non-integer multiplier greater than unity. The count from the second digital counter 104 is an m-bit digital number that is coupled to the "A" input of the digital magnitude comparator 110.

The resolution factors K1 and K2 of the first and second digital counters 102 and 104 may be integers or non-integers. In one embodiment of the invention, K1 and K2 are both integer powers of two, such that $2^n=K1$ ($n=\log_2 K1$) and $2^m=K2$ ($m=\log_2 K2$). Using K1 and K2 that are integer powers of two is beneficial in that it affords the ability to implement the duty cycle translator 100 using low-cost digital circuitry. K1 and K2 may also be equal or unequal. In one embodiment of the invention $K1=K2=2^7=128$ so that $n=m=7$, thereby providing seven-bit resolution for each of the first and second digital counters 102 and 104.

Figure 2:
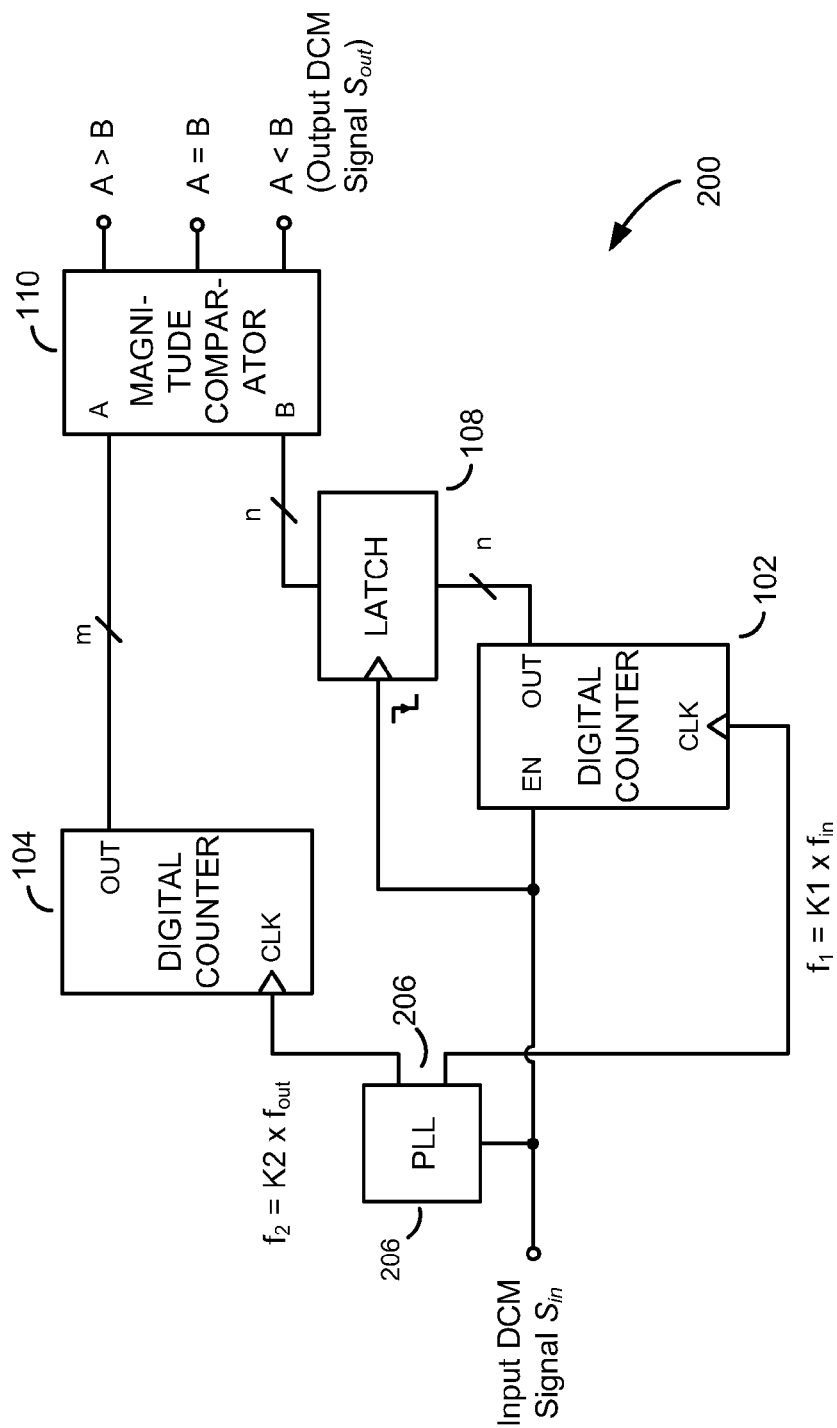
FIG. 2 is a circuit diagram of a duty cycle translator, according to an embodiment of the present invention.

The low-frequency input clock and high-frequency output clock may or may not be related. In one embodiment of the invention, the two clocks are harmonically related such that $f_{out}=M \times f_{in}$ and M is positive integer representing the harmonic order of the high-frequency clock. As illustrated in FIG. 2, harmonically related clocks requires the use of only a single PLL 206 to generate the first and second digital counter clocks for the first and second digital counters 102 and 104.

Following each pulse in the input DCM signal $S_{in}$, the digital magnitude comparator 110 compares the n-bit digital number held by the latch 108 and representing the duration of the pulse to the continuously incrementing count from the second digital counter 104. As the second digital counter 104 counts from zero, its count eventually exceeds the count held by the latch 108, causing the "A<B" output of the digital magnitude comparator 110 to transition low. Because the high-frequency clock has a frequency $f_{out}$ that is M times higher than the frequency $f_{in}$ of the low-frequency input clock, i.e., because $f_{out}=M \times f_{in}$, the second digital counter 104 completes M count cycles (each count cycle ranging from 0 to K2-1) for each period $1/f_{in}$ of the low-frequency input clock. The digital count at input A becomes greater than the count applied to input B once during each of these M count cycles. Accordingly, the "A<B" output of the digital magnitude comparator 110, which is the output from which the desired output DCM signal $S_{out}$ is produced, also transitions from high to low M times for each period $1/f_{in}$ of the low-frequency input clock, the transition times depending on the width of the particular pulse being processed.

Figure 3A:
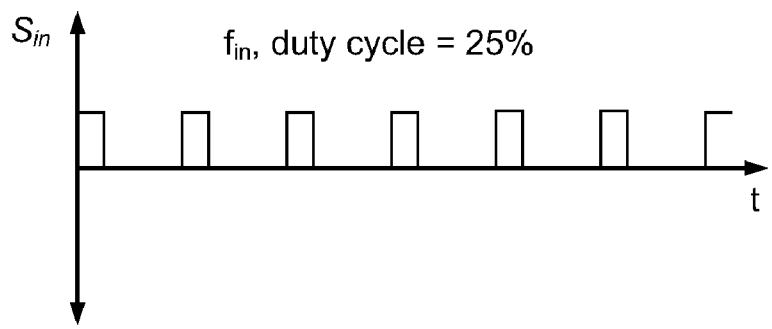
FIGS. 3A and 3B are signal diagrams illustrating how the output duty-cycle-modulated (DCM) signal $S_{out}$ (FIG. 3B) of a duty cycle translator of the present invention has a higher frequency than the input DCM signal $S_{in}$ (FIG. 3A) but the same duty cycle.
Figure 3B:
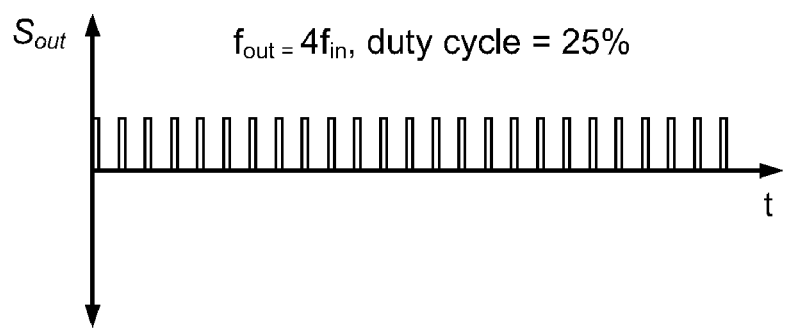

Whereas the duty cycle translator 100 operates to increase the input frequency from $f_{in}$ to $f_{out}$, the duty cycle information in the output DCM signal $S_{out}$ remains unchanged from the duty cycle information contained in the original input DCM signal $S_{in}$. This is illustrated in FIGS. 3A and 3B, where for a multiplier M=4 and periodic input DCM signal $S_{in}$ having an input duty cycle of 25% and frequency $f_{in}$ (FIG. 3A), the duty cycle translator 100 translates the input signal $S_{in}$ to an output signal $S_{out}$ having a 4× higher output frequency $f_{out}=M \times f_{in}=4f_{in}$ but unchanged duty cycle of 25% (FIG. 3B).

Figure 4:
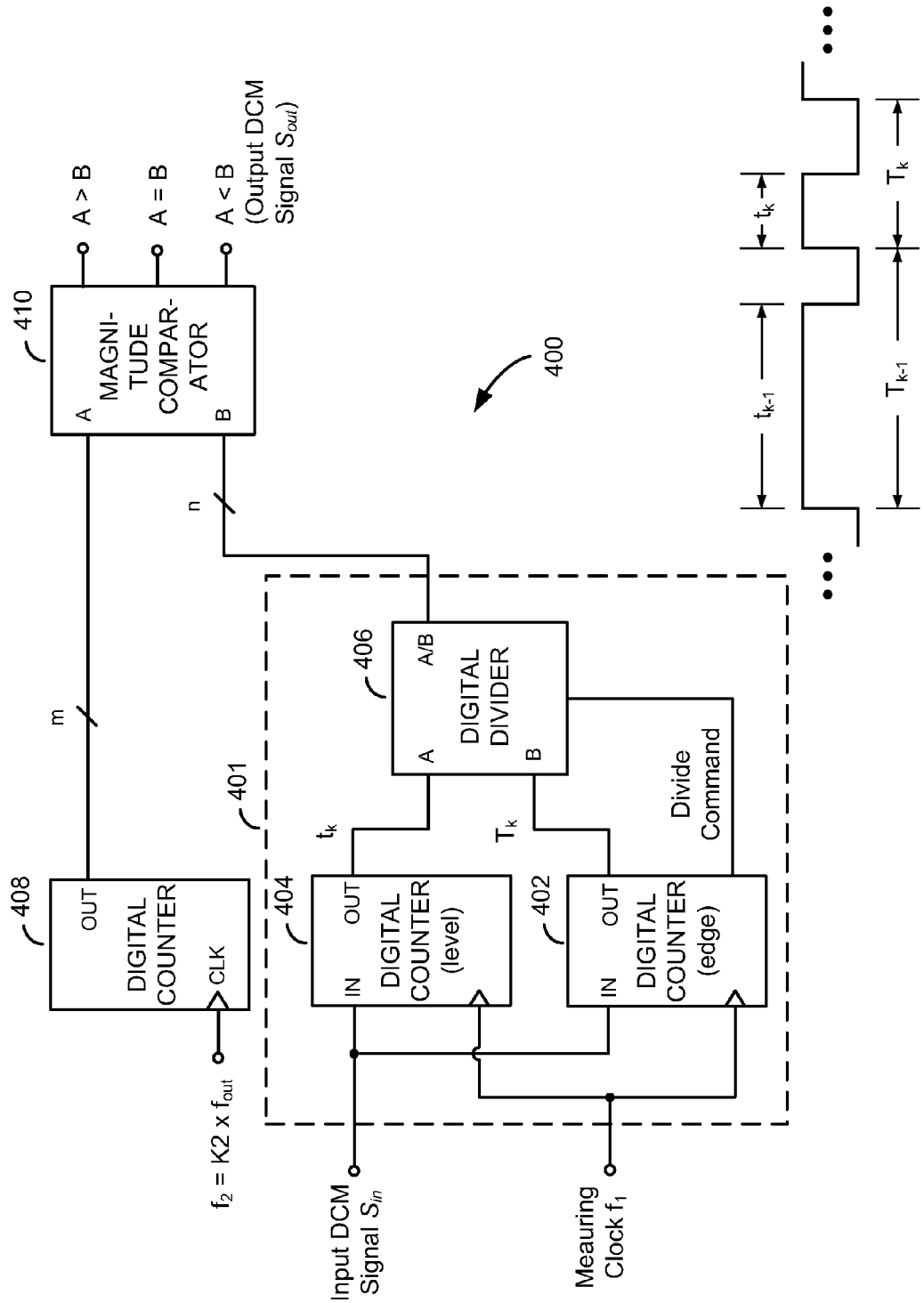
FIG. 4 is a circuit diagram of a duty cycle translator, according to an embodiment of the present invention.

The exemplary duty cycle translator 100 in FIG. 1 works well for input DCM signals $S_{in}$ that are periodic, such as PWM signals. For input DCM signals $S_{in}$ that are aperiodic or have a variable periodicity, the duty cycle translator 400 shown in FIG. 4 may be used. The duty cycle translator 400 may be referred to as a "generalized" duty cycle translator since it is operable to translate duty cycle information for input DCM signals $S_{in}$ of all types, including periodic, aperiodic, and variable-periodicity or semi-periodic signals.

The generalized duty cycle translator 400 comprises a duty cycle evaluator 401 that includes first and second digital counters 402 and 404 and a digital divider 406; a third digital counter 408; and a digital magnitude comparator 410. The first and second digital counters 402 and 404 are configured to count at a measuring clock rate $f_1$ determined by the desired or required measuring resolution, and measure the period and active high time (i.e., pulse duration) of each cycle of the input DCM signal $S_{in}$. The first digital counter 402 is edge-triggered and counts between consecutive rising edges of the incoming input DCM signal $S_{in}$. The second digital counter 404 is level-triggered and counts during times when the input DCM signal $S_{in}$ is active high. At the end of each cycle of the input DCM signal $S_{in}$, a divide command commands the digital divider 406 to divide the count at the output of the second digital counter 404 by the count at the output of the first digital counter 402, thereby producing an n-bit digital number representing the duty cycle of the input DCM signal $S_{in}$ for that cycle of the input DCM signal $S_{in}$. Immediately following the divide command, the first and second digital counters 402 and 404 are reset to zero and counting begins for the next cycle of the input DCM signal $S_{in}$. In general, because the input DCM signal $S_{in}$ has a variable periodicity and variable duty cycle, the digital divider 406 produces a unique n-bit digital number for each cycle of the input DCM signal $S_{in}$.

The third digital counter 408 is configured to repeatedly and continuously count from zero to K2-1 count (zero to K2-1 is one "count cycle") at a rate $f_2$, where $f_2 f_{out} > f_1$, producing an m-bit digital number. The digital magnitude comparator 410 is configured to compare the incrementing m-bit digital number to the n-bit digital number produced by the duty cycle generator 401. (Note that the most-significant bits of the m- and n-bit digital numbers are aligned at the "A" and "B" inputs so that each digital number represents a fraction ranging from 0 and 1.) At the beginning of each count cycle of the third digital counter 408, the m-bit digital number is zero, so the "A<B" output of the digital magnitude comparator 410, which is the output from which the desired output DCM signal $S_{out}$ is produced, is high. Eventually the m-bit digital number increments to a value that exceeds the n-bit digital number from the duty cycle generator 401, and the "A<B" output of the digital magnitude comparator 410 drops and remains low until the full count cycle (0 to K2-1) completes. Once the count cycle has completed, the third digital counter 408 resets to zero and a new count cycle is started.

The third digital counter 408 completes multiple count cycles for each period of the input DCM signal $S_{in}$, the total number of count cycles completed depending on how much higher $f_{out}$ is compared to the measuring clock frequency $f_1$ and on the duration of the next adjacent cycle of the input DCM signal $S_{in}$. This result is an output DCM signal $S_{out}$ having a higher frequency $f_{out}$ (or data rate) than the input DCM signal $S_{in}$ but the same duty cycle information.

Duty cycle translators similar to the duty cycle translators 100 and 400 described above are employed in various application-specific embodiments of the invention described below.

Figure 5:
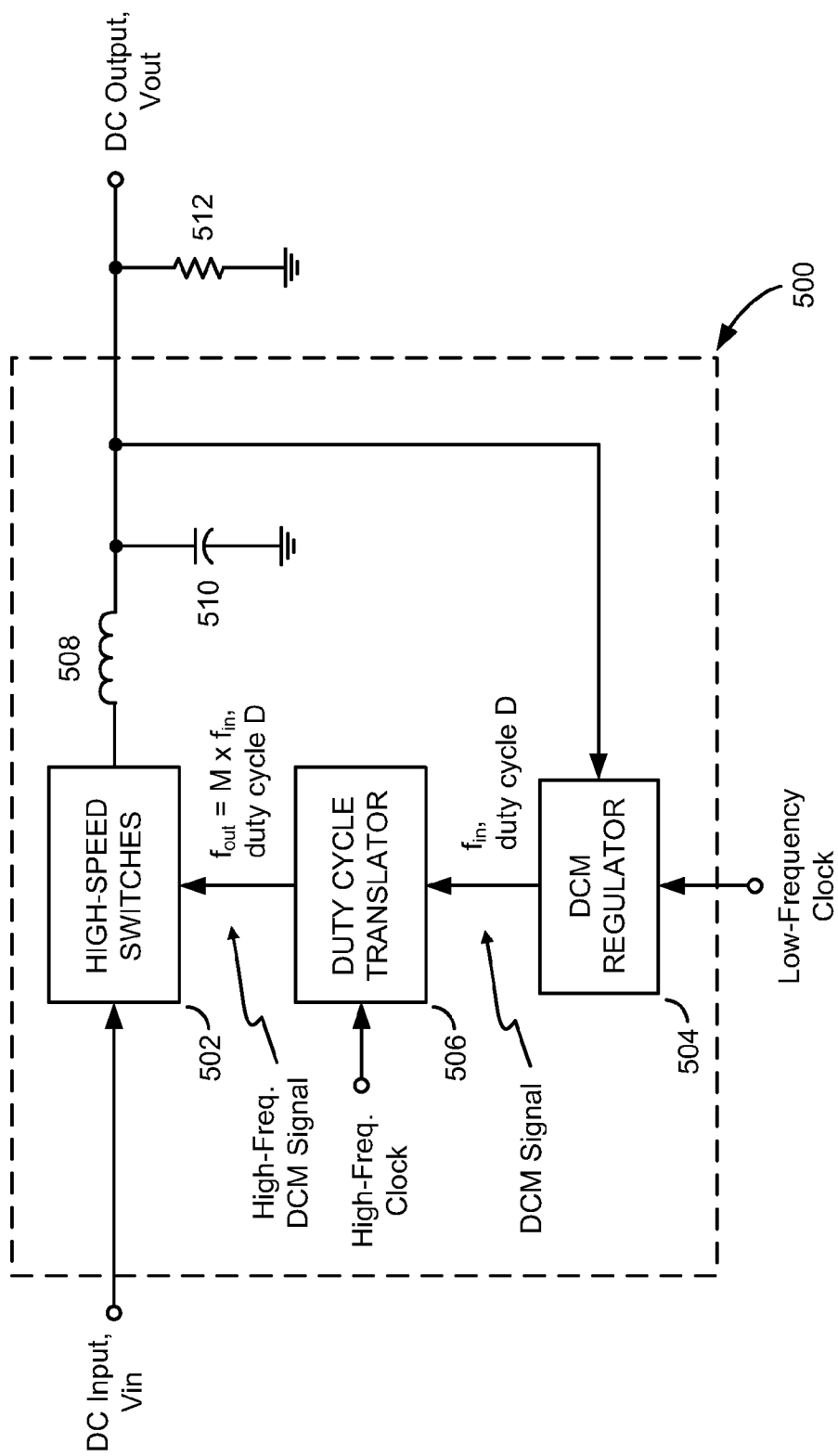
FIG. 5 is a diagram of direct current to direct current (DC-DC) converter, according to an embodiment of the present invention.

FIG. 5 is a block diagram of a switch-mode direct current to direct current (DC-DC) converter 500 that employs a duty cycle translator 506 similar to the duty cycle translator 100 or duty cycle 400, according to an embodiment of the present invention. The DC-DC converter 500 comprises one or more high-speed switches (e.g., bipolar junction transistors (BJTs) or field effect transistors (FETs) 502), a duty cycle modulation (DCM) regulator 504, the duty cycle translator 506, an energy storage inductor 508, and an output capacitor 510.

The DC-DC converter 500 is formed using discrete components, one or more IC chips, or a combination of discrete components and IC chips. In one embodiment, for example, the DCM regulator 504, duty cycle translator 506, and high-speed switches are formed in a single IC chip. In another embodiment, the DCM regulator 504 and duty cycle translator 506 are formed in a first silicon-based IC chip (e.g., as manufactured according to a standard complementary metal-oxide-semiconductor (CMOS) semiconductor manufacturing process), and the high-speed switches 502 are formed in a second, compound-semiconductor-based (e.g., silicon carbide (SiC), gallium arsenide (GaAs), gallium nitride (GaN), indium phosphide (IP)) IC chip.

The DC-DC converter 500 operates by alternately coupling and decoupling the energy storage inductor 508 to and from the DC input by controlling the one or more high-speed switches 502 in response to a high-frequency DCM control signal generated by the duty cycle translator 506. When the high-speed switches 502 cause the energy storage inductor 508 to be coupled to the DC input, current through the energy storage inductor 508 rises linearly while energy builds up and is stored in the inductor's 508's magnetic field. When the high-speed switches 502 switch and decouple the energy storage inductor 508 from the DC input, the inductor current falls linearly and energy that had been previously stored in the inductor's 508's magnetic field discharges into the output capacitor 510 and DC-DC converter's load 512. The output capacitor 510 is selected to have a capacitance such that the R-C time constant, where R represents the load resistance of the load 512 and C represents the capacitance of the output capacitor 510, is much longer than the period of the high-frequency DCM control signal. This results in a DC output voltage $V_{out}$ which on average equals the DC input voltage $V_{in}$ multiplied by the duty cycle of the high-frequency DCM control signal, i.e., $V_{out,avg}=D\times V_{in}$.

The output of the DC-DC converter 500 is regulated by feeding back the DC output voltage $V_{out}$ to the DCM regulator 504. In one embodiment of the invention, the DCM regulator 504 comprises a PWM regulator configured to generate a PWM signal having a frequency $f_{in}$ and a duty cycle that varies depending on to what degree the actual output voltage deviates from its desired value. The duty cycle translator 506 is substantially similar to the duty cycle translator 100 or duty cycle translator 400 shown and described above in connection with FIG. 1 and FIG. 4, and operates to translate the DCM signal to a high-frequency DCM signal having the same duty cycle information as the DCM signal. Driving the one or more high-speed switches 502 using the high-frequency DCM signal (instead of using the lower-frequency DCM signal) allows much smaller energy storage inductor 508 and output capacitor 510 values to be used. Indeed, for a high-frequency clock that is one hundred times higher than the low-frequency input clock, i.e., for $f_{out}=M\times f_{in}=100\times f_{in}$, the energy storage inductor 508 and output capacitor 510 values can be reduced by as much as 99%.

Figure 6:
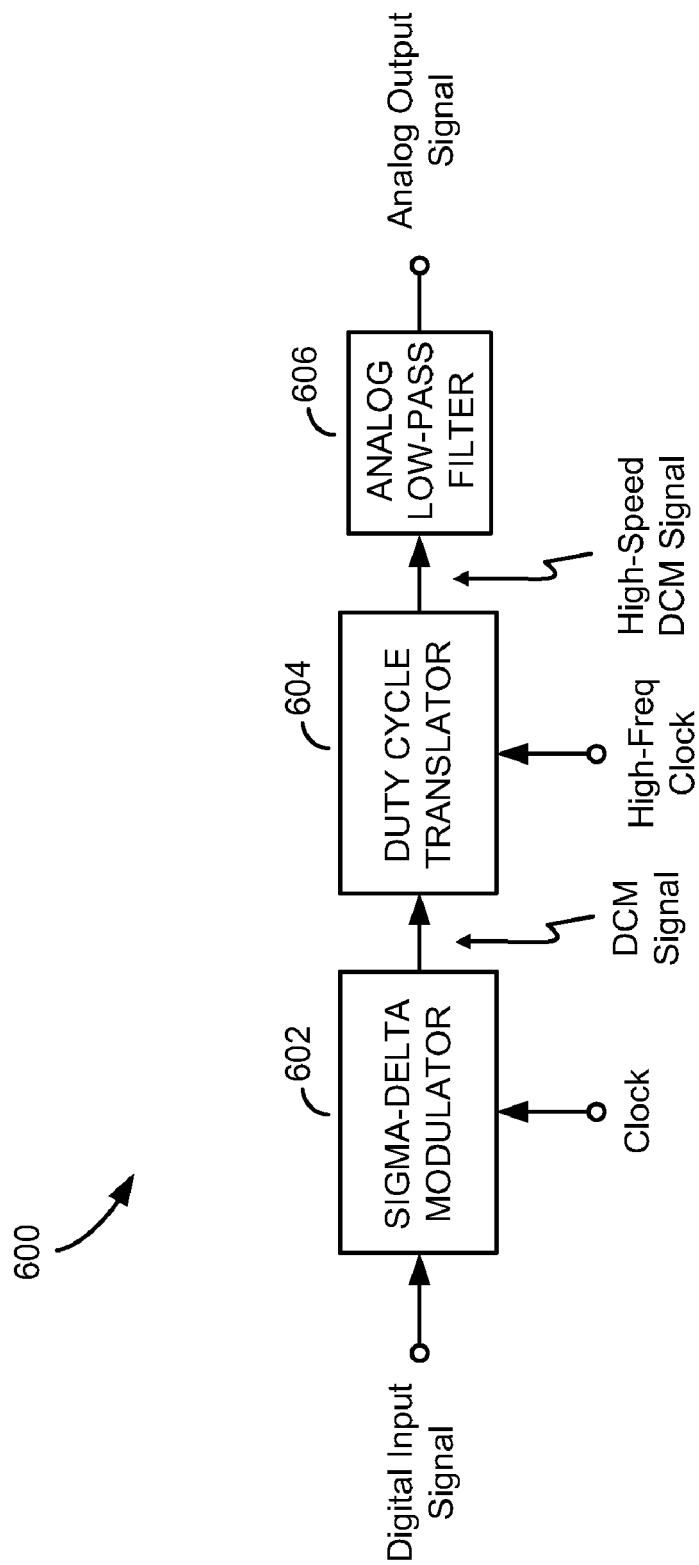
FIG. 6 is diagram of a digital-to-analog converter (DAC), according to an embodiment of the present invention.

FIG. 6 is a block diagram of a sigma-delta digital-to-analog converter (DAC) 600 that employs a duty cycle translator 604 similar to the duty cycle translator 100 or duty cycle translator 400, according to an embodiment of the present invention. The sigma-delta DAC 600 comprises a sigma-delta modulator 602, the duty cycle translator 604 and a low-pass filter (LPF) 606. Like the DC-DC converter 400, the DAC 600 is formed using discrete components, one or more IC chips, or a combination of discrete components and IC chips.

The sigma-delta modulator 602 operates to transform a multi-bit digital input signal (e.g., a pulse code modulated (PCM) signal) to a single-bit serial signal. The single-bit serial signal may contain a series of fixed-width pulses, the density of pulses over time representing the magnitude of the digital input signal. This single-bit serial signal may be referred to as a pulse-density modulated (PDM) signal. Similar to a PWM signal, the PDM signal is a DCM signal, the only difference being in how the duty cycle $D=t/T$ is modulated. For the PWM signal, the signal period T is fixed and t is allowed to vary within 0<t<T, whereas for the PDM signal, t is fixed and modulation is accomplished by varying the low time (T−t) between consecutive pulses.

The duty cycle translator 604 of the sigma-delta DAC 600 is similar to the duty cycle translator 100 shown and described above. It operates to generate a high-speed DCM signal having a higher speed (i.e., pulse rate) but same duty cycle information as the DCM signal produced at the output of the sigma-delta modulator 602. The high-speed DCM signal is coupled to the input of the LPF 606. The LPF 606 functions essentially to average the high-speed DCM signal. Accordingly, since the density of pulses in the high-speed DCM signal represents the average amplitude of the input signal over time, the analog version of the original multi-bit digital input signal from the high-speed DCM signal is recovered by the LPF 606. Using the duty cycle translator 604 allows the LPF component values to be made smaller than would otherwise be required, by as much as the ratio $f_{out}/f_{in}$ where $f_{in}$ is the frequency of the DCM signal applied to the duty cycle translator input and $f_{out}=M\times f_{in}$ is the frequency of the high-frequency clock of the duty cycle translator 604.

Figure 7:
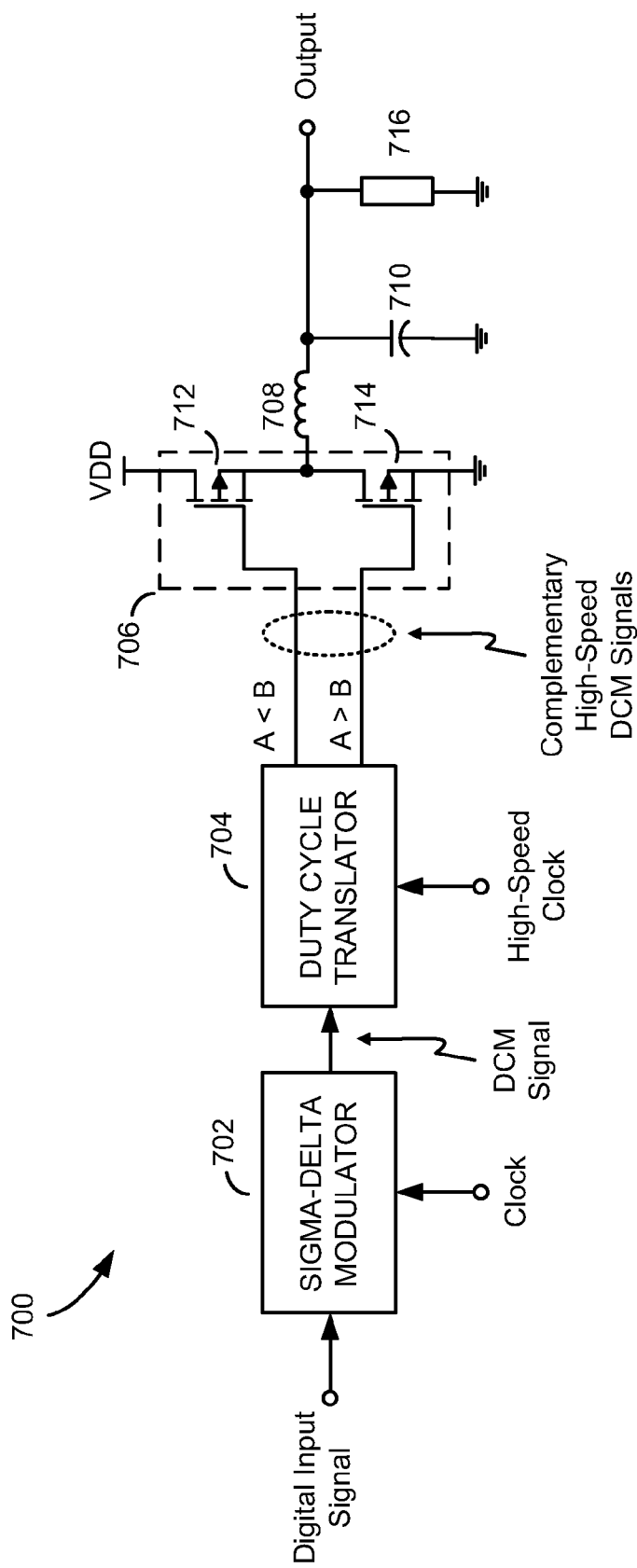
FIG. 7 is diagram of a switching amplifier, according to an embodiment of the present invention.

FIG. 7 is a block diagram of a switching amplifier 700 that employs a duty cycle translator 704 similar to the duty cycle translator 100 or duty cycle translator 400, according to an embodiment of the present invention. The switching amplifier 700 comprises a sigma-delta modulator 702, the duty cycle translator 704, a switching stage 706, an inductor 708, and an output capacitor 710, and is formed using discrete components, one or more IC chips, or a combination of discrete components and IC chips. In one embodiment, the sigma-delta modulator 702 and duty cycle translator 704 are formed in one IC chip and the components of the switching stage 706 are formed in a second IC chip. In another embodiment, the sigma-delta modulator 702, duty cycle translator 704, and switching stage 706 are all formed in a single IC chip.

The sigma-delta modulator 702 and duty cycle translator 704 function similar to the sigma-delta modulator 702 and duty cycle translator 704 of the sigma-delta DAC 700 in FIG. 7, creating complementary high-speed DCM signals at the "A<B" and "A>B" outputs of the duty cycle translator 704. The complementary high-speed DCM signals have a higher pulse rate than the lower-speed DCM signal applied to the input of the duty cycle translator 704 but have the same duty cycle information as the lower-speed DCM signal. (It should be pointed out that rather than using the sigma-delta modulator 702 to generate the DCM signal, a pulse-width modulator can be alternatively used, similar to as in conventional Class-D switching amplifier. The DCM (PWM) signal produced by the pulse-width modulator would then be translated to a higher frequency using the duty cycle translator 704.)

The switching stage 706 of the switching amplifier 700 comprises first and second transistors 712 and 714, such as metal-oxide-semiconductor field-effect transistors (MOSFETs), metal-semiconductor FETs (MESFETs), heterojunction BJTs, high-electron-mobility transistors (HEMTs), or other suitable switching devices. The gates of the first and second transistors 712 and 714 are driven by the complementary high-speed DCM signals produced at the "A<B" and "A>B" outputs of the duty cycle translator 704. Depending on the type and input characteristics of the transistors 712 and 714 used for the switching stage, an output driver and/or level-shifter may be included between the output of the duty cycle translator 704 and switching stage 706, as will be appreciated and understood by those of ordinary skill in the art. (It should be mentioned that for similar reasons an output driver and/or level-shifter may also be used in the DC-DC converter 500 in FIG. 5 and in other embodiments of the invention.)

The output of the switching stage 706 is fed to the inductor 708 and output capacitor 710, which together form an LPF. The L-C LPF has a cut-off frequency much lower than the switching frequency of the switching stage 706. Hence, switching energy from the switching stage 706 is prevented from reaching the load 716 (which in the case of an audio input comprises one or more speakers). The L-C LPF also functions to average the output signal of the switching stage 706 to form an amplified analog signal (e.g., an audio signal) having signal characteristics corresponding to the modulation in the original digital input signal. Similar to the DC-DC converter 400 described above, employing the duty cycle translator 704 affords the ability to use smaller-sized and lower-valued components for the L-C LPF.

Figure 8:
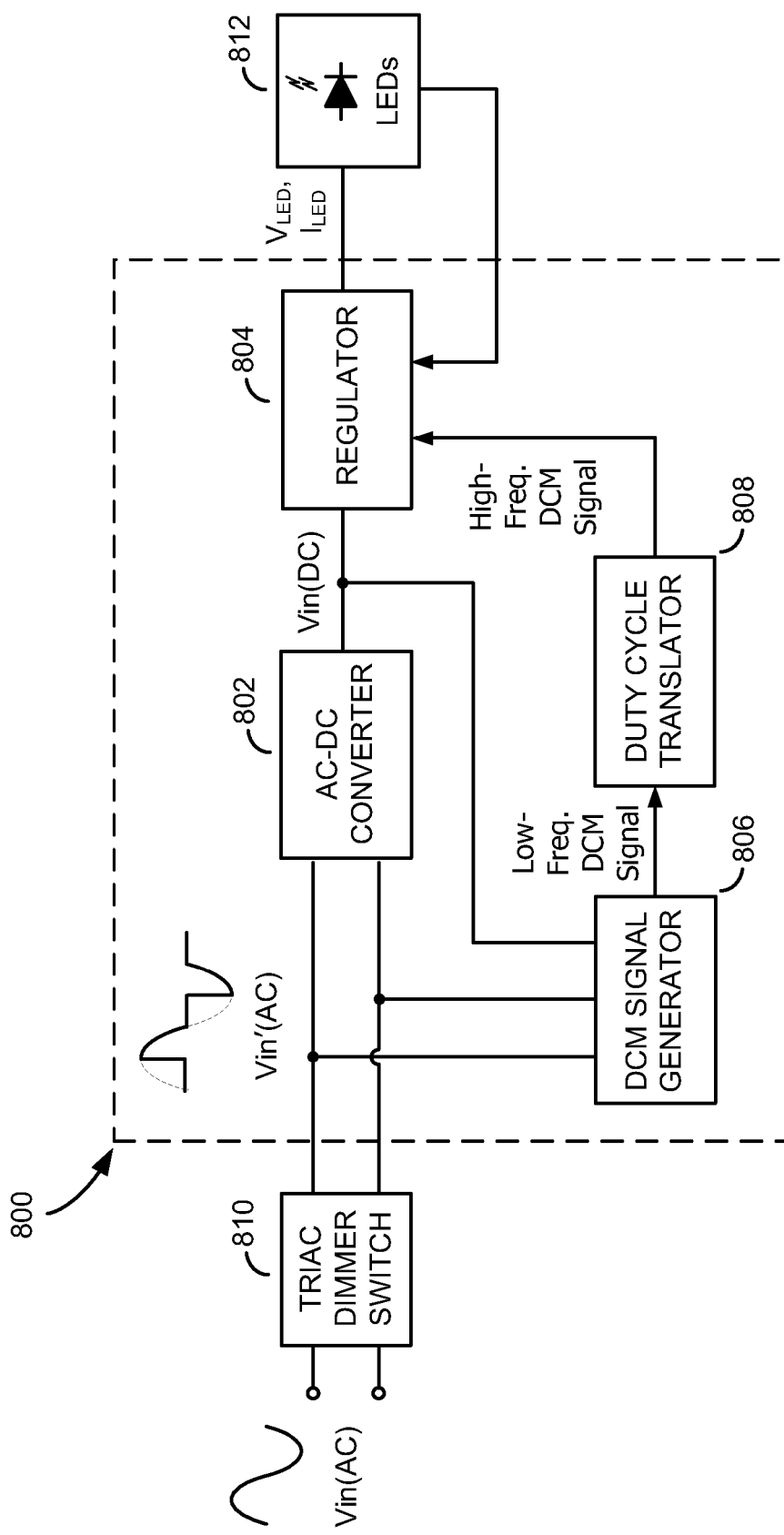
FIG. 8 is a diagram of a power supply module for a light emitting device, according to an embodiment of the present invention.

FIG. 8 is a block diagram of a light-emitting diode (LED) power supply module 800 for an LED light bulb or other light-emitting device, according to an embodiment of the present invention. The LED power supply module 800 comprises an alternating current to direct current (AC-DC) converter 802, a regulator 804, a DCM signal generator 806, and a duty cycle translator 808. Like the other embodiments of the invention, the LED power supply module 800 is formed using discrete components, one or more IC chips, or a combination of discrete components and IC chips. As explained in further detail below, the duty cycle translator 808 is configured to generate a high-frequency DCM signal for controlling the dimming of a plurality of LEDs 812, which may be connected in series, parallel, or individually controlled and powered as described in U.S. patent application Ser. No. 12/897,066, entitled "Power Conversion and Control Systems and Methods for Solid-State Lighting," which is hereby incorporated by reference.

The AC-DC converter 802 comprises a rectifier and switch-mode, step-down converter or transformer, as is understood by those of ordinary skill in the art. Alternatively, a direct conversion AC-DC converter is used, such as, or similar to, the rectifier-less direct conversion AC-DC converter described in co-pending and commonly assigned U.S. patent application Ser. No. 12/841,608, entitled "AC/DC Power Conversion Methods and Apparatus," which is hereby incorporated by reference. Employing a direct conversion AC-DC converter of this type is advantageous in that it reduces parts count and manufacturing costs, lowers power consumption, and results in an overall reduction in size of the LED power supply module 800.

The DC voltage Vin(DC) produced at the output of the AC-DC converter 802 is supplied to the regulator 804. The regulator 804 comprises a current or voltage regulator for regulating the voltage $V_{LED}$ supplied across, or current $I_{LED}$ flowing through, the plurality of LEDs 812.

Figure 9:
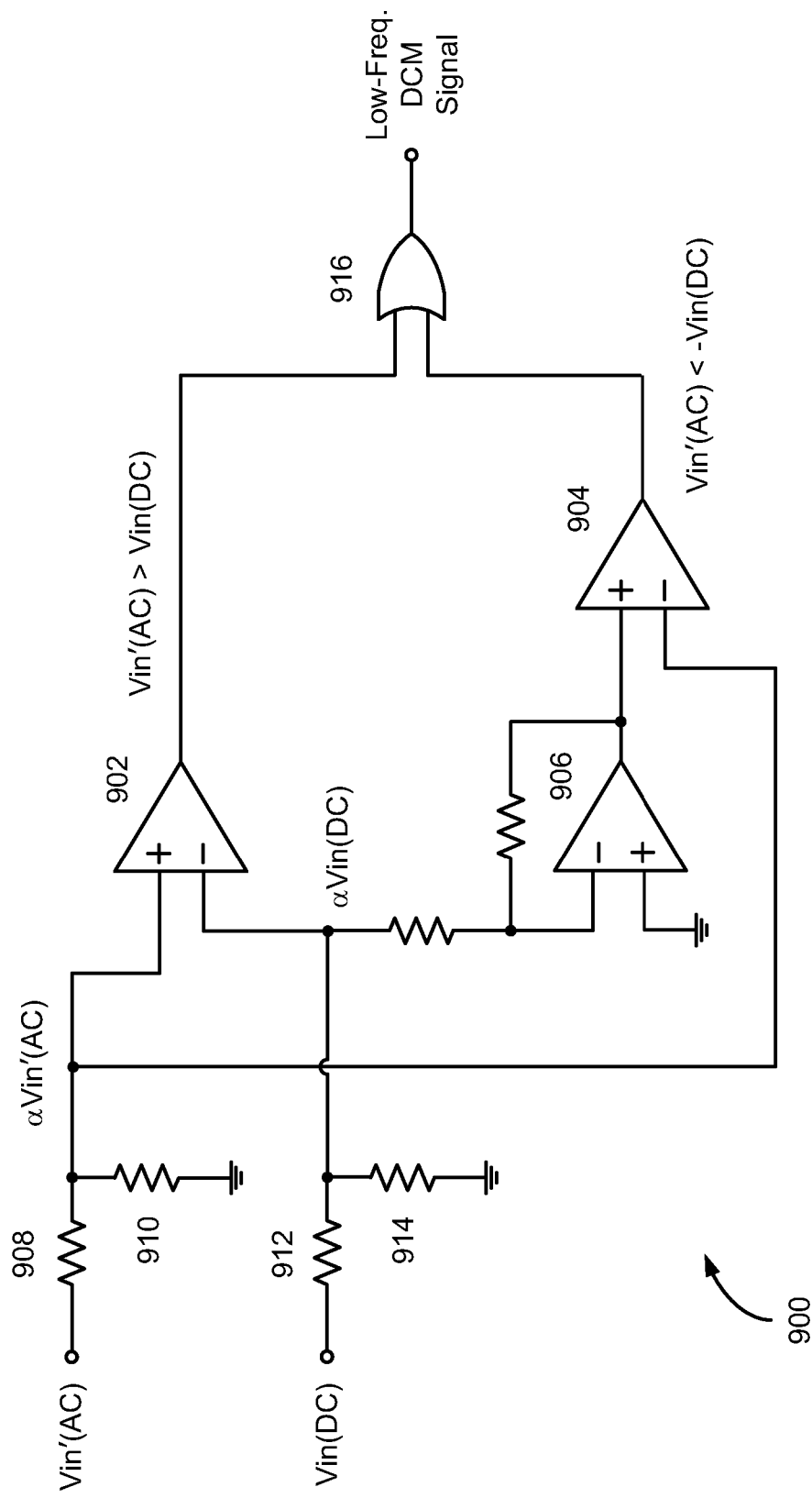
FIG. 9 is a schematic diagram of an exemplary DCM signal generator that may be used to generate the low-frequency DCM signal in the power supply module in FIG. 8.

The DCM signal generator 806 is configured to generate a low-frequency DCM signal from a dimmer-modified AC input voltage Vin'(AC) provided by the TRIAC dimmer switch 810. The DCM signal generator 806 may be implemented in various ways. FIG. 9 is schematic diagram of an exemplary DCM signal generator 900 that may be used. The DCM signal generator 900 comprises first and second comparators 902 and 904, an inverting amplifier 906, a first voltage divider including resistors 908 and 910 (or, alternatively, capacitors), a second voltage divider including resistors 912 and 914 (or, alternatively, capacitors), and an OR logic gate 916. The first and second voltage dividers may not be necessary depending on the acceptable input voltage ranges of the various amplifiers. If, however, the dimmer-modified AC input voltage Vin'(AC) is not within the acceptable input ranges, it is scaled down using the first and second voltage dividers. Specifically, the first voltage divider scales the dimmer-modified AC input voltage Vin'(AC) down to a scaled, dimmer-modified AC input voltage αVin(AC) so that the voltage is within the acceptable input voltage range limit of the first and second comparators 902 and 904, and the second voltage divider scales the DC voltage Vin(DC) from the output of the AC-DC converter 802 by the same amount to produce a scaled DC voltage αVin(DC). The first comparator 902 compares the scaled, dimmer-modified AC input voltage αVin'(AC) to the scaled DC voltage αVin(DC), producing a high output voltage level when Vin'(AC)>Vin(DC) and a low output voltage level when Vin'(AC)<Vin(DC). The inverting amplifier 906 inverts the scaled DC voltage αVin(DC) to produce a scaled, inverted DC voltage −αVin(DC). The second comparator 904 compares the scaled, inverted DC voltage −αVin(DC) to the scaled, dimmer-modified AC input voltage αVin'(AC), producing a high output voltage when Vin'(AC)<−Vin(DC) and a low output voltage when Vin'(AC)> −Vin(DC). Finally, as illustrated in the timing signal diagrams in FIGS. 10A-D, the OR logic gate generates the desired low-frequency DCM signal, which has a logic high ("1") whenever |Vin'(AC)|>Vin(DC) and a logic low ("0") for all other times.

The low-frequency DCM signal has a duty cycle that varies depending on the dim setting of the TRIAC dimmer switch 810. The low-frequency DCM signal could be used to control the dimming of the plurality of LEDs 812 directly. However, to avoid any perceptibility of flickering, according to one embodiment of the invention it is first translated up in frequency by the duty cycle translator 808. Similar to the duty cycle translators 100 and 400 described above, the duty cycle translator 808 operates to translate the low-frequency DCM signal to a high-frequency DCM signal. Whereas the high-frequency DCM signal has a higher frequency it contains the same duty cycle information as the original, low-frequency DCM signal.

The high-frequency DCM signal is used to control the power available to the plurality of LEDs 812 depending on the dim setting of the TRIAC dimmer switch 810. In one embodiment, the regulator 804 comprises a current source that is controlled by the high-frequency DCM signal, thereby duty cycling the LED current $I_{LED}$ in accordance with the duty cycle information in the high-frequency DCM signal.

While various embodiments of the present invention have been described, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments but, instead, should be determined by the appended claims, including the full scope of equivalents to which such claims are entitled.

What is claimed is:

1. A duty cycle translator, comprising:
    a duty cycle evaluator configured to receive an input duty-cycle-modulated (DCM) signal and generate a first digital number representing a duty cycle of the input DCM signal;
    a first digital counter configured to generate a second digital number; and
    a comparator configured to compare the first and second digital numbers and generate an output DCM signal having a higher frequency or higher data rate than a frequency or data rate of the input DCM signal and a duty cycle that is substantially the same as a duty cycle of the input DCM signal
    wherein said duty cycle evaluator comprises:
    a second digital counter configured to generate a count representing a portion of a period of the input DCM signal during which the input DCM signal is high;
    a third digital counter configured to generate a count representing a period of the input DCM signal; and
    a divider configured to divide the count from said second digital counter by the count from said third digital counter to generate said first digital number.

2. A method of translating duty cycle information in a duty-cycle-modulated (DCM) to a higher frequency or data rate, comprising:
    receiving an input DCM signal;
    generating a first digital number representing a duty cycle of the input DCM signal at a first rate;
    generating a second digital number at a second rate higher than said first rate; and
    comparing the first and second digital numbers to form an output DCM signal having a higher frequency or data rate than a frequency or data rate of the input DCM signal and a duty cycle that is substantially the same as a duty cycle of the input DCM signal,
    wherein generating the first digital number at the first rate comprises:
    generating a first count representing a portion of a period of the input DCM signal during which the input DCM signal is high;
    generating a second count representing a period of the input DCM signal; and
    dividing said first count by said second count to generate said first digital number.

* * * * *